US006426020B1

(12) United States Patent
Okada et al.

(10) Patent No.: US 6,426,020 B1
(45) Date of Patent: Jul. 30, 2002

(54) ETCHANT FOR COPPER OR COPPER ALLOYS

(75) Inventors: Masao Okada; Maki Arimura; Masayo Kuriyama, all of Amagasaki (JP)

(73) Assignee: MEC Co., Ltd., Amagasaki (JP)

( * ) Notice: Subject to any disclaimer, the term of this patent is extended or adjusted under 35 U.S.C. 154(b) by 0 days.

(21) Appl. No.: 09/708,600

(22) Filed: Nov. 9, 2000

(30) Foreign Application Priority Data

Nov. 10, 1999 (JP) ............................................. 11-319918
Apr. 24, 2000 (JP) ............................................ 2000-12294

(51) Int. Cl.⁷ ............................................... C09K 13/00
(52) U.S. Cl. ........................ 252/79.1; 252/79.3; 252/79.4
(58) Field of Search ............................... 252/79.1, 79.3, 252/79.4; 138/752; 216/105, 106

(56) References Cited

U.S. PATENT DOCUMENTS 4,695,348 A * 9/1987 Battery et al. ................. 216/20
5,532,094 A * 7/1996 Arimura et al. ............ 252/79.1
5,807,493 A * 9/1998 Maki et al. .................. 216/106

FOREIGN PATENT DOCUMENTS

| JP | 80-015512 | 4/1980 |
| JP | 6-017266 | 1/1994 |
| JP | 7-292483 | 11/1995 |

* cited by examiner

Primary Examiner—Benjamin L. Utech
Assistant Examiner—Binh X Tran
(74) Attorney, Agent, or Firm—Oblon, Spivak, McClelland, Maier & Neustadt, P.C.

(57) ABSTRACT

An etchant for copper or copper alloys comprising 5–50 wt % of an alkanolamine, a copper ion source in the amount of 0.2–10 wt % as copper, a halide ion source in the amount of 0.005–10 wt % as halogen, 0.1–30 wt % of an aliphatic carboxylic acid, and the balance water, wherein the molar ratio of the alkanolamine to one mol of the aliphatic carboxylic acid is two or more. The etchant is free from problems such as instability of the liquid composition and unpleasant odor, has a high etching rate, exhibits only very slight corrosion even if a small amount of residue is left on the surface and is capable of producing a roughened surface when used for microetching.

20 Claims, No Drawings

ETCHANT FOR COPPER OR COPPER ALLOYS

BACKGROUND OF THE INVENTION

1. Field of the Invention

The present invention relates to an etchant for copper or copper alloys useful in the manufacture of printed circuit boards and the like.

2. Description of the Background Art

Microetching is performed in the production of printed circuit boards to remove contamination and oxides from the surface of copper and to obtain an active copper surface. Microetching is an operation of slightly etching a surface, usually less than 5 $\mu$m in depth. Microetching is performed as a pretreatment for lamination or coating of resins such as an etching resist, solder resist, insulating layer, a pretreatment for electroless plating or electroplating, a pretreatment for soldering, and the like. In particular, when resins are laminated or coated, microetching is performed to produce a roughened surface exhibiting improved adhesion with the resins.

Conventionally, persulfate-based microetching compositions, sulfuric acid-hydrogen peroxide-type microetching compositions, and the like are used as microetching compositions.

However, conventional persulfate-based microetcing compositions have drawbacks such as a low etching rate and fluctuation in the etching rate due to unstable properties of etching solutions caused by decomposition of persulfate compounds. Another problem is related to metals other than copper, such as a tin lead alloy (solder), nickel, and gold, used in printed circuit boards. When microetching such a printed circuit board, the tin lead alloy or nickel may also be etched or discolored.

Sulfuric acid-hydrogen peroxide type microetching compositions also have such problems as instability of etching solutions due to decomposition of hydrogen peroxide which results in fluctuation in the etching rate, discoloration of metals other than copper, and the like.

An alkaline etchant containing copper ammonium complex ion as a major component is used in a circuit patterning step in the process of photoetching. This alkaline etchant also exhibits instability in the liquid composition, namely the etching rate tends to fluctuate. An additional problem with this etchant is a strong ammonia odor which impairs working environmental conditions.

Japanese Patent Publication No. 55-15512 discloses a neutral etchant containing a copper (II) ion source such as copper (II) chloride and a complexing agent such as monoethanolamine, and an alkaline etchant prepared by further adding an ammonium salt such as ammonium chloride. However, this neutral etchant exhibits a low etching rate and the alkaline etchant imparts an ammonia odor.

Japanese Patent Application Laid-open No. 6-17266 discloses a surface treating composition containing a copper (II) ion source such as copper (II) chloride and an alkanolamine, which the applicant claims is useful in removing gray or black films formed on a lead frame surface etched using an aqueous solution of iron (II) chloride or the like. However, this surface treating composition cannot be used as an etchant because of a low copper etch rate.

Japanese Patent Application Laid-open No. 7-292483 discloses a surface treating composition which is an aqueous solution containing a copper (II) complex of an azole compound, an organic acid, and a halide ion, and optionally alkanolamine. However, the amount of alkanolamine in this surface treating composition must not be in excess of the equivalent amount of the organic acid. If alkanolamine in excess of the amount of the organic acid is added, the copper etching rate is retarded.

Therefore, an object of the present invention is to provide an etchant in which the above problems in conventional etchants have been overcome, namely, the present invention provides an etchant free from problems such as instability of the liquid composition and unpleasant odor, and exhibiting a high etching rate.

Another object of the present invention is to provide an etchant exhibiting only very slight corrosion even if a small amount of residue is left on the surface, and capable of producing a roughened surface when used for microetching.

The inventors of the present invention have conducted extensive studies and have been successful in solving the above-described problems in the prior art by using the following etchant.

SUMMARY OF THE INVENTION

Specifically, the above object is solved in the present invention by an etchant for copper or copper alloys comprising 5–50wt % (hereinafter simply indicated by "%") of an alkanolamine, a copper ion source in the amount of 0.2–10% as copper, a halide ion source in the amount of 0.005–10% as halogen, 0.1–30% of an aliphatic carboxylic acid, and the balance water, wherein the molar ratio of the alkanolamine to one mol of the aliphatic carboxylic acid is two or more.

In a preferred embodiment of the above etchant, the copper ion source is a copper (II) ion source, the amount of the halide ion source is 0.005–5wt % as a halogen, the amount of the aliphatic carboxylic acid is 2–30 wt %, and the etchant has a pH in the range of 7.5 to 11.5.

Other objects, features and advantages of the invention will hereinafter become more readily apparent from the following description.

DETAILED DESCRIPTION OF THE INVENTION AND PREFERRED EMBODIMENTS

The alkanolamine is a component acting as a complexing agent to dissolve copper. A low molecular weight alkanolamine having a molecular weight of 500 or less is preferable, because such a low molecular weight alkanolamine produces a low viscosity etching solution which ensures uniform etching and is suitable for etching to form fine circuit patterns.

As specific examples of such an alkanolamine, monoethanolamine and its derivatives such as N-methylethanolamine, N-ethylethanolamine, N-butylethanolamine, N,N-dimethylethanolamine, N,N-diethylethanolamine, N,N-dibutylethanolamine, 2-(2-hydroxy)ethoxyethanolamine; diethanolamine and its derivatives such as N-methyldiethanolamine and N-butyldiethanolamine; triethanolamine, propanolamine, iso-propanolamine, and hydroxy ethylpiperazine, as well as derivatives of these may be given.

The concentration of alkanolamines is 5–50%, and preferably 10–30%. If the concentration of alkanolamines is less than 5%, the etching rate becomes low; if more than 50%, the viscosity of the etchant increases. When a copper complex of an alkanolamine, which is hereinafter discussed, is used as a copper ion source, an alkanolamine in the amount of 5% or more is added in addition to the alkanolamine forming the copper complex. In this instance, the upper limit of 50% for alkanolamines in the etchant must be observed.

In addition, the ratio of the alkanolamine to one mol of the aliphatic carboxylic acid, which is discussed later, is two mols or more. If this ratio is less than two mols, the etching rate is retarded.

The copper ion source is a component which forms a complex with the above-described alkanolamine and acts as an oxidant of copper. As the copper ion source, the above-mentioned copper complexes of alkanolamine, copper hydroxide, copper complexes of aliphatic carboxylic acid which are discussed later, copper halides such as copper chloride and copper bromide, copper carbonate, copper sulfate, copper oxide, and the like can be given. The copper ion sources may be either the compounds which generate the copper (I) ion or the compounds which generate the copper (II) ion. When the concentration of halide ion described later is less than 5%, the compounds generating the copper (II) ion are preferred due to their capability of dissolving copper in a stable manner.

The concentration of the copper ion sources is 0.2–10% as copper, and preferably 1–6% as copper. If the concentration is less than 0.2%, the etching rate becomes low. The etching rate also becomes low when the concentration is more than 10%. When a copper halide is used as the copper ion source, the copper halide should be added in such an amount that the concentration of the halide ion does not exceed 10%.

The halide ion sources increase copper solubility in the etchant, copper dissolution stability, and the etching rate. In addition, the halide ion sources exhibit an action of roughening copper surfaces. As specific examples of the halide ion sources, inorganic acids such as hydrochloric acid, hydrobromic acid, and hydroiodic acid, and inorganic salts such as copper chloride, copper bromide, iron chloride, sodium chloride, sodium iodide, ammonium chloride, and the like can be given. Of these, the compounds which generate a bromide ion are preferred when the etchant of the present invention is used for microetching those surfaces of copper or copper alloys which must be roughened due to their high capability of roughening such surfaces.

The concentration of the halide ion sources is 0.005–10% as halide ion. If this concentration is less than 0.005%, the etching rate is retarded. On the other hand, an effect proportionate to the amount of addition cannot be expected if more than 10% of the halide ion sources is added. In addition, when used for microetching those surfaces of copper or copper alloy swhich are roughened, such excessive addition may interfere with the capability of the etchant of roughening such surfaces. Furthermore, the above concentration is preferably 5% or less in the case where residues of the etchant are apt to remain on the treated surfaces. If more than 5%, the residues of the etchant remaining corrode the treated surfaces.

An aliphatic carboxylic acid is added to the etchant of the present invention to increase dissolving stability of copper and to adjust the pH.

Given as specific examples of aliphatic carboxylic acids are aliphatic saturated monocarboxylic acids such as formic acid, acetic acid, propionic acid, butyric acid, valeric acid, and caproic acid; aliphatic unsaturated monocarboxylic acids such as acrylic acid, crotonic acid, and isocrotonic acid; aliphatic saturated dicarboxylic acids such as oxalic acid, malonic acid, succinic acid, glutaric acid, adipic acid, and pimelic acid; aliphatic unsaturated dicarboxylic acids such as maleic acid; aliphatic oxycarboxylic acids such as glycolic acid, lactic acid, malic acid, and citric acid; aliphatic carboxylic acids with substituents such as β-chloropropionic acid, hydroxypivalic acid, and levulinic acid; and derivatives of these aliphatic carboxylic acids.

Of these, aliphatic monocarboxylic acids are preferable because of their properties of not interfering with the copper oxidizing activity of alkanolamine complexes and a low viscosity of the resulting etching solution.

The concentration of the aliphatic carboxylic acids is 0.1–30%, and preferably 0.1–15%. If the concentration of the aliphatic carboxylic acids is less than 0.1%, the effect of the addition is insufficient. The addition of more than 30% of the aliphatic carboxylic acids, on the other hand, decreases the pH, which results in a low etching rate. When the concentration of halide ion is less than 5%, the concentration of aliphatic carboxylic acids in the range of 2–30%, and particularly 7–15%, is preferable in view of the etching rate. When a copper complex of an aliphatic carboxylic acid is used as the copper ion source, the concentration of aliphatic carboxylic acids, including the aliphatic carboxylic acid which forms the complex, is from 0.1 to 30%.

In addition to the above components, a rust preventive agent such as benzotriazole, a surfactant for ensuring uniform etching such as polyalkylene glycol and polyalkylene glycol derivatives, and the like may be added to the etchant of the present invention. In addition, a salt of the above-mentioned aliphatic carboxylic acid, a salt of the above-mentioned alkanolamine, a salt of inorganic acid, and the like may be added to improve the properties of the solution and to stabilize the surface configuration when the etchant of the present invention is used for roughening surfaces.

Although the etchant of the present invention maybe acidic, neutral, or alkaline according to the kind and concentration of the alkanolamine and aliphatic carboxylic acid, it is desirable to control the pH in the range of 7.5–11.5, and more particularly 8.2–10.8, to maintain a high etching rate when the halogen concentration is less than 5%.

The etchant of the present invention can be easily prepared by dissolving the above-described components in water. Ion-exchanged water is preferably used as the water for this purpose. There is no specific limitation to the method of applying the etchant of the present invention. For example, a method of spraying the etchant to copper or a copper alloy, a method of immersing the copper or copper alloy in the etchant, and the like are given. The temperature of the etchant is preferably from 10 to 50° C., and the treating time is preferably from 10 to 120 seconds, and particularly preferably 10 to 60 seconds in the case of microetching.

When used for microetching copper or a copper alloy, the etchant of the present invention can not only remove stains and oxides from the surface thereby producing an active surface, but also can produce an irregular surface which exhibits superior adhesion to resins. Therefore, the etchant of the present invention is useful as a pretreatment for lamination or coating an etching resist or a solder resist, a pretreatment for lamination or coating an interlayer insulation resin, a pretreatment for electroless plating or electroplating, a pretreatment for forming a rust preventive film such as a preflux for printed circuit boards, and the like.

In addition, because the resulting surface has excellent solderability, the etchant of the present invention is also useful in a pretreatment for a hot air leveler process and soldering of electronic parts. For the solder used for the above-mentioned soldering, in addition to a tin-lead eutectic solder, lead-free solders such as tin-copper-bismuth-based solder, tin-silver-copper-based solder, tin-silver-bismuth-based solder, and tin-zinc-based solder can be used. The etchant of the present invention can also be preferably used for surface finishing of lead frames, and the like. Furthermore, because the etchant of the present invention does not corrode a tin-lead alloy, nickel, or gold, the etchant is useful for treating printed wiring boards and semiconductor parts in which these metals are present together with copper.

Moreover, because the etchant of the present invention may etch the surface opposed to spray nozzles faster than the other surfaces using a spraying method, the etchant can be preferably used for high aspect ratio etching in a photoetching process for forming circuit patterns on printed circuit boards. Control of the etching rate is also easy. Although tin, tin lead alloys, nickel/gold laminated layers, and the like can be given as etching resists in addition to thermosetting resins and photosensitive resins, tin, tin lead alloys, nickel, and gold which are not corroded by the etchant of the present invention can also be used as etching resists.

A semi-additive method which is one method for fabricating printed circuit boards involves a process of forming a circuit pattern which comprises steps of forming a base conductive layer of electroless plating copper film, a copper sputtering film, or a copper foil, forming a plating resist thereon, forming a copper electroplating film on an insulating material surface, removing the resist, then removing the base conductive layer on which the copper electroplating film has not been formed by etching. The process has an additional step of roughening the surface of the circuit pattern by microetching to improve adhesion with a solder resist or an interlayer insulation resin. This microetching step can be omitted if the etchant of the present invention is used for removing the base conductive layer because the etchant can roughen the circuit surface simultaneously when removing the base conductive layer. Therefore, a problem of making a narrow circuit by microetching in the case of a fine circuit can be overcome. In addition, when the base conductive layer is an electroless plating copper film, the etchant of the present invention not only removes the base conductive layer and roughens the circuit surfaces, but also can dissolve and remove the palladium catalyst for electroless plating which is present on the insulating material surface in the spaces between the circuits, whereby copper migration between the circuits can be prevented.

In the above semi-additive method, the electrolysis copper plating layer is occasionally covered with an etching resist when removing the base conductive layer to prevent dissolution of the copper electroplating layer which becomes a circuit pattern. In this instance, the aforementioned tin, tin lead alloys, nickel, or gold may be used as the etching resist.

As described above, the present invention provides an etchant free from problems such as instability of the liquid composition and unpleasant odor, and exhibiting a high etching rate.

In addition, the present invention provides an etchant exhibiting only very slight corrosion even if a small amount of residue is left on the surface and capable of producing a roughened surface when used for microetching.

Other features of the invention will become apparent in the course of the following description of the exemplary embodiments which are given for illustration of the invention and are not intended to be limiting thereof.

EXAMPLES

Examples 1–4 and Comparative Examples 1–3

Compositions of the etchants used in the Examples and Comparative Examples are shown in Table 1.

TABLE 1

|  | Component | (wt %) | Concentration/pH | |
|---|---|---|---|---|
| Example 1 | Triethanolamine | 30 | Copper | 1.4 |
|  | Acetic acid | 5 | Halogen | 1.6 |
|  | Copper (II) chloride | 3 | pH | 9.0 |
|  | Ion-exchanged water | 62 |  |  |
| Example 2 | Monoethanolamine copper (II) complex | 29 | Alkanolamine | 19.1 |
|  | Acrylic acid | 15 | Copper | 9.9 |
|  | Potassium iodide | 0.1 | Halogen | 0.08 |
|  | Ion-exchanged water | 55.9 | pH | 8.5 |
| Example 3 | N-Butylethanolamine | 40 | Aliphatic carboxylic acid | 7.0 |
|  | Copper (II) glycolate | 10 | Copper | 3.0 |
|  | Hydrobromic acid (42%) | 1 | Halogen | 0.4 |
|  | Benzotriazole | 0.5 | pH | 10.8 |
|  | Ion-exchanged water | 48.5 |  |  |
| Example 4 | Propanolamine chloride | 10 | Alkanolamine | 7.0 |
|  | Adipic acid | 7 | Copper | 1.3 |
|  | Copper (II) hydroxide | 2 | Halogen | 3.0 |
|  | Ammonium phosphate | 0.2 | pH | 9.5 |
|  | Polyoxyethylene nonylphenyl ether | 0.8 |  |  |
|  | Ion-exchanged water | 80 |  |  |
| Comparative Example 1 | Sulfuric acid (98%) | 10 |  |  |
|  | Hydrogen peroxide (35%) | 5 |  |  |
|  | Ion-exchanged water | 85 |  |  |
| Comparative Example 2 | Sodium persulfate | 10 |  |  |
|  | Sulfuric acid (98%) | 2 |  |  |
|  | Ion-exchanged water | 88 |  |  |
| Comparative Example 3 | Triethanolamine | 3 |  |  |
|  | Acetic acid | 2 |  |  |
|  | Copper (II) chloride | 3 |  |  |
|  | Ion-exchanged water | 92 |  |  |

(Evaluation of Etching Uniformity)

Etchants, each having the composition shown in Table 1, were sprayed onto both-side copper-clad laminated boards for printed circuit boards (FR-4 grade) with dimensions of 50 mm×50 mm×1.6 mm under the conditions of a liquid temperature of 25° C. and a spray pressure of 0.07 Mpa for 20 seconds. The boards were then washed with water and dried. After the treatment, the etching amount (depth) was calculated from the weight change of the copper-clad laminated board and the copper surface was observed by naked eyes. The results are shown in Table 2.

(Color Change Evaluation of Tin Lead Alloy)

After plating a tin lead alloy (solder) onto the above both-side copper-clad laminated boards for printed circuit boards, the etchant with compositions shown in Table 1 were sprayed under the same spray conditions as mentioned above. The boards were then washed with water and dried. The surface of the tin lead alloy after the treatment was observed by the naked eye. The results are shown in Table 2.

(Evaluation of Corrosion)

A both-side copper-clad laminated board for printed circuit boards (FR-4 grade) with dimensions of 150 mm×70 mm×1.6 mm with 1,000 through-holes having a diameter of 0.3 mm were dipped into an etchant having the composition shown in Table 1 at 25° C. for one minute. The board was removed from the etchant. The board was heated at 230° C. for 3 minutes without washing and left in a high humidity thermostat at 60° C. and 90% RH for 30 days to examine occurrence of circuit breakage in through-holes by measuring electric resistance in the through-holes. The results are shown in Table 2, wherein the following remarks apply.

A: The copper surface was uniformly etched.

B: The copper surface was not uniform and some areas on the copper surface were red.

C: No color change.

D: Color turned to black.

TABLE 2

|  | Example | | | | Comparative Example | | |
|---|---|---|---|---|---|---|---|
|  | 1 | 2 | 3 | 4 | 1 | 2 | 3 |
| Etching amount (μm) | 1.0 | 1.2 | 1.2 | 0.6 | 1.5 | 0.3 | 0.2 |
| Copper surface | A | A | A | A | A | B | B |
| Tin-lead alloy surface | C | C | C | C | D | D | C |
| Circuit brakage (%) | 0 | 0 | 0 | 0 | 32.6 | 22.5 | 0 |

As shown in Table 2, the etchants of the Examples produced uniform etching of 0.6 μm or more in 20 second spraying. In addition, no breakage occurred even though the specimens were not washed with water after the treatment. In contrast, when a sulfuric acid- hydrogen peroxide etchant was used (Comparative Example 1), the tin lead alloy was corroded, the color turned to black, and breakage of the circuit occurred. When a persulfate etchant was used (Comparative Example 2), the amount of etching was as small as 0.3 μm and etching was not uniform. The tin lead alloy was corroded, the color turned to black, and breakage of the circuit occurred. When an etchant with a low alkanolamine concentration was used (Comparative Example 3), the etching rate was low and etching was not uniform.

Examples 5–9 and Comparative Examples 4–5

(Evaluation of Resin Adhesive Properties of Roughened Surface)

Etchants were prepared by mixing the components listed in Table 3. The surface of a both-side copper-clad laminated board for printed circuit boards (FR-4 grade) with dimensions of 50 mm×50 mm×1.6 mm was electrolytically plated with copper and sprayed with the above-described etchant under the conditions of a liquid temperature of 30° C. and a spray pressure of 0.14 Mpa for 60 seconds to roughen the surface. The amount of etching at this time is shown in Table 3. A solder resist (PSR-4000, manufactured by Taiyo Ink Manufacturing Co., Ltd.) was coated onto the surface, irradiated, developed, and cured.

After curing, 1 mm×1 mm square cross-cuts were produced on the solder resist according to JIS K5400.8.5.2. The specimen was dipped in a 3.5% hydrochloric acid aqueous solution at room temperature (about 20° C.) for 10 minutes, washed with water, and dried. Then, the cross-cut peeling test using a cellophane tape was carried out according to JIS K5400.8.5.2. The number of solder resist squares attached to cellophane tape and peeled off from the substrate was examined by the naked eye. The adhesive properties were judged according to the following standards. The results are shown in Table 1.

AAA: No solder resist squares attached to the cellophane tape.

BBB: A small number of solder resist squares attached to the cellophane tape.

CCC: Most solder resist squares attached to the cellophane tape.

(Evaluation of Roughened Surface Solderability)

A solder resist (PSR-4000, manufactured by Taiyo Ink Manufacturing Co., Ltd.) was coated onto the surface of the above both-side copper-clad laminated boards for printed circuit boards (FR-4 grade) on which copper had been electrolytically plated. The coating was irradiated, developed, and cured to form 560 holes each having a diameter of 1.5mm for solderability evaluation. The test specimen was etched by spraying the above etchant at a liquid temperature of 30° C. and a spray pressure of 0.14 Mpa for 20 seconds to roughen the surface.

A solder leveling flux (W-221, manufactured by MEC Co., Ltd.) was applied to the surface of the resulting test specimen, followed by soldering using a vertical-type solder leveler at a solder temperature of 240° C., a dipping time of four seconds, an air temperature of 220° C., a squeezing pressure of 0.3 Mpa, to examine the proportion of the area to which solder become attached. The results are shown in Table 3.

TABLE 3

|  | Component | (wt %) | Concentration | | Etching amount μm | Adhesion | Solderability % |
|---|---|---|---|---|---|---|---|
| Example 5 | Diethanolamine | 40 | Copper | 3.7 | 3.5 | BBB | 99.7 |
|  | Copper (II) chloride · 2H$_2$O | 10 | Chlorine | 4.2 |  |  |  |
|  | Acetic acid | 2 |  |  |  |  |  |
|  | Ion-exchanged water | Balance |  |  |  |  |  |
| Example 6 | N,N-Diethanolamine | 30 | Copper | 1.0 | 1.3 | AAA | 100 |
|  | Hydrobromic acid (47%) | 4.2 | Bromine | 2.0 |  |  |  |
|  | Copper (II) acetate · H$_2$O | 3 | Acetic acid | 0.9 |  |  |  |

TABLE 3-continued

| | Component | (wt %) | Concentration | | Etching amount μm | Adhesion | Solderability % |
|---|---|---|---|---|---|---|---|
| | Polyethylene glycol 400 | 0.01 | | | | | |
| | Ion-exchanged water | Balance | | | | | |
| Example 7 | Monoethanolamine | 20 | Copper | 1.4 | 2.5 | AAA | 100 |
| | Potassium bromide | 5 | Bromine | 3.4 | | | |
| | Copper (II) formate · 4H₂O | 5 | Formic acid | 1.0 | | | |
| | Ion-exchanged water | Balance | | | | | |
| Example 8 | Triethanolamine | 8 | Copper | 2.8 | 1.1 | AAA | 100 |
| | Malic acid | 5 | Bromine | 7.2 | | | |
| | Copper (II) bromide | 10 | | | | | |
| | Ion-exchanged water | Balance | | | | | |
| Example 9 | Monoethanolamine | 15 | Copper | 4.4 | 2.1 | AAA | 100 |
| | Copper (I) oxide | 5 | Bromine | 2.3 | | | |
| | Sodium bromide | 3 | | | | | |
| | Citric acid | 0.1 | | | | | |
| | Ion-exchanged water | Balance | | | | | |
| Comparative Example 4 | Sodium persulfate | 10 | | | 0.8 | CCC | 83.5 |
| | Sulfuric acid (98%) | 1 | | | | | |
| | Ion-exchanged water | Balance | | | | | |
| Comparative Example 5 | Sulfuric acid | 7 | | | 3.2 | CCC | 81.4 |
| | Hydrogen peroxide (35%) | 4 | | | | | |
| | Methyl alcohol | 1 | | | | | |
| | Ion-exchanged water | Balance | | | | | |

As clear from Table 3, the copper surface treated with the etchant of the present invention exhibited superior adhesion to a solder resist and excellent solderability. In contrast, when a persulfate etchant (Comparative Example 4) or a sulfuric acid-hydrogen peroxide etchant was used (Comparative Example 5), the solder resist was easily removed and there was a comparatively large area to which solder did not become attached.

Obviously, numerous modifications and variations of the present invention are possible in light of the above teachings. It is therefore to be understood that, within the scope of the appended claims, the invention may be practiced otherwise than as specifically described herein.

What is claimed is:

1. An etchant for copper or copper alloys comprising 5–50 wt % of an alkanolamine, a copper ion source in the amount of 0.2–10 wt % as copper, a halide ion source in the amount of 0.005–10 wt % as halogen, 0.1–30 wt % of an aliphatic carboxylic acid, and the balance water, wherein the molar ratio of the alkanolamine to one mol of the aliphatic carboxylic acid is two or more.

2. The etchant according to claim 1, wherein the halogen is bromine.

3. The etchant according to claim 1, wherein the amount of the aliphatic carboxylic acid is 0.1–15 wt %.

4. The etchant according to claim 1, wherein the aliphatic carboxylic acid is an aliphatic monocarboxylic acid.

5. The etchant according to claim 1, wherein the alkanolamine is present in an amount of 10–30 wt %.

6. The etchant according to claim 1, wherein the copper ion source is selected from the group consisting of copper complexes with an alkanolamine, copper hydroxide, copper complexes with an aliphatic carboxylic acid, copper halides, copper chloride, copper bromide, copper carbonate, copper sulfate, and copper oxide.

7. The etchant according to claim 1, wherein the copper ion source is present in an amount of 1–6 wt % as copper.

8. The etchant according to claim 1, wherein the halide ion source is selected from the group consisting of hydrochloric acid, hydrobromic acid, hydroiodic acid, copper chloride, copper bromide, iron chloride, sodium chloride, sodium iodide, and ammonium chloride.

9. The etchant according to claim 1, wherein the halide ion source is present in an amount of 0.005–5 wt % as halide ion.

10. The etchant according to claim 1, wherein the aliphatic carboxylic acid is selected from the group consisting of formic acid, acetic acid, propionic acid, butyric acid, valeric acid, caproic acid, acrylic acid, crotonic acid, isocrotonic acid, oxalic acid, malonic acid, succinic acid, glutaric acid, adipic acid, pimelic acid, maleic acid, glycolic acid, lactic acid, malic acid, citric acid, β-chloropropionic acid, hydroxypivalic acid, levulinic acid.

11. The etchant according to claim 1, wherein the aliphatic carboxylic acid is present in an amount of 0.1–15 wt %.

12. The etchant according to claim 1, wherein the aliphatic carboxylic acid is present in an amount of 2–30 wt % and the halide ion is present in an amount of less than 5 wt %.

13. The etchant according to claim 1, further comprising a rust preventive agent and/or a surfactant.

14. The etchant according to claim 1, wherein the pH of said etchant is 7.5–11.5.

15. The etchant according to claim 1, wherein the pH of said etchant is 8.2–10.8.

16. The etchant according to claim 1, wherein the molecular weight of the alkanolamine is 500 or less.

17. The etchant according to claim 1, wherein the alkanolamine is selected from the group consisting of monoethanolamine, N-methyethanolamine, N-ethylethanolamine, N-butylethanolamine, N,N-dimethylethanolamine, diethylethanolamine, N,N-dibutylethanolamine, 2-(2-hydroxy)ethoxyethanolamine, diethanolamine, N-methyldiethanolamine, N-butyldiethanolamine, triethanolamine, propanolamine, iso-propanolamine, hydroxy ethylpiperazine.

18. The etchant according to claim 1, wherein the copper ion source is a copper (II) ion source, the amount of the halide ion source is 0.005–5 wt % as halogen, the amount of the aliphatic carboxylic acid is 2–30 wt %, and the etchant has a pH in the range of 7.5 to 11.5.

19. The etchant according to claim 18, wherein the halogen is bromine.

20. The etchant according to claim 18, wherein the aliphatic carboxylic acid is an aliphatic monocarboxylic acid.

* * * * *

UNITED STATES PATENT AND TRADEMARK OFFICE
CERTIFICATE OF CORRECTION

PATENT NO.   : 6,426,020 B1  Page 1 of 1
DATED        : July 30, 2002
INVENTOR(S)  : Masao Okada et al.

It is certified that error appears in the above-identified patent and that said Letters Patent is hereby corrected as shown below:

<u>Title page,</u>
Item [30], the Foreign Application Priority Data is incorrect. Item [30] should read:

-- Foreign Application Priority Data
  Nov. 10, 1999  (JP) ........................... 11-319918
  Apr. 24, 2000  (JP) ........................... 2000-122947 --

Signed and Sealed this

Seventeenth Day of December, 2002

JAMES E. ROGAN
*Director of the United States Patent and Trademark Office*

UNITED STATES PATENT AND TRADEMARK OFFICE
CERTIFICATE OF CORRECTION

PATENT NO.  : 6,426,020 B1
DATED       : July 30, 2002
INVENTOR(S) : Masao Okada et al.

It is certified that error appears in the above-identified patent and that said Letters Patent is hereby corrected as shown below:

<u>Column 10,</u>
Line 51, insert -- N,N- -- before "diethylethanolamine"

Signed and Sealed this

Fifth Day of August, 2003

JAMES E. ROGAN
*Director of the United States Patent and Trademark Office*